United States Patent
Weigand

(10) Patent No.: US 9,450,345 B2
(45) Date of Patent: Sep. 20, 2016

(54) CONNECTOR ASSEMBLY WITH FLEXIBLE CIRCUIT BOARD

(71) Applicant: ODU GmbH & Co. KG, Mühldorf (DE)

(72) Inventor: Josef Weigand, Heldenstein (DE)

(73) Assignee: ODU GMBH & CO. KG, Mühldorf (DE)

( * ) Notice: Subject to any disclaimer, the term of this patent is extended or adjusted under 35 U.S.C. 154(b) by 0 days.

(21) Appl. No.: 14/704,992

(22) Filed: May 6, 2015

(65) Prior Publication Data
US 2015/0325958 A1 Nov. 12, 2015

(30) Foreign Application Priority Data
May 6, 2014 (EP) .................................... 14167213

(51) Int. Cl.
H01R 12/00 (2006.01)
H01R 13/66 (2006.01)
H01R 13/46 (2006.01)
H01R 12/59 (2011.01)
H01R 12/63 (2011.01)
H05K 1/11 (2006.01)
H05K 1/18 (2006.01)

(52) U.S. Cl.
CPC .......... *H01R 13/665* (2013.01); *H01R 12/592* (2013.01); *H01R 12/63* (2013.01); *H01R 13/46* (2013.01); *H01R 13/6658* (2013.01); *H05K 1/118* (2013.01); *H05K 1/189* (2013.01); *H05K 2201/052* (2013.01); *H05K 2201/053* (2013.01); *H05K 2201/2009* (2013.01)

(58) Field of Classification Search
CPC .................................... H01R 12/59
USPC ............................................. 439/76.1, 77, 67
See application file for complete search history.

(56) References Cited

U.S. PATENT DOCUMENTS

| | | | |
|---|---|---|---|
| 3,214,713 A | 10/1965 | Strobel | |
| 3,766,439 A * | 10/1973 | Isaacson | H05K 1/189 174/252 |
| 4,811,165 A * | 3/1989 | Currier | H01R 23/70 361/716 |
| 5,194,010 A * | 3/1993 | Dambach | H01R 12/57 439/499 |
| 5,474,473 A | 12/1995 | Perretta et al. | |

(Continued)

FOREIGN PATENT DOCUMENTS

| NL | 7005071 A | 10/1970 |
|---|---|---|
| WO | 9416478 A1 | 7/1994 |
| WO | 2008020946 A1 | 2/2008 |

OTHER PUBLICATIONS

European Search Report of counterpart European Patent Application No. 14167213.9 issued on Oct. 10, 2014.

*Primary Examiner* — Phuong Dinh

(57) ABSTRACT

The invention relates to an electrical connector (1), comprising a plurality of terminals (4), and a circuit board (7). The circuit board (7) comprises a plurality of traces for electrically connecting the terminals (4) with a plurality of pads (11). The pads (11) can electrically connect strands from a cable with the traces. The circuit board (7) further comprises a vertical connecting portion (8) for connecting the terminals (4) with the traces, and a first horizontal connecting portion (10) with pads (11), wherein the first horizontal connecting portion (10) is physically connected to the vertical connecting portion (8). According to the invention the circuit board (7) comprises a second horizontal connecting portion (10) with pads (11).

19 Claims, 4 Drawing Sheets

(56) References Cited

U.S. PATENT DOCUMENTS

| | | |
|---|---|---|
| 7,758,374 B2 | 7/2010 | Yu et al. |
| 7,938,650 B2 | 5/2011 | Helmig et al. |
| 8,133,071 B2 * | 3/2012 | Huang ................ H01R 12/778 439/499 |
| 8,430,692 B2 * | 4/2013 | Peng .................... H01R 13/518 439/607.46 |
| 8,974,251 B2 * | 3/2015 | Zong .................... H01R 13/665 439/660 |
| 2011/0111628 A1 | 5/2011 | Su et al. |

* cited by examiner

CONNECTOR ASSEMBLY WITH FLEXIBLE CIRCUIT BOARD

CROSS-REFERENCE TO RELATED APPLICATIONS

This application claims the benefit of European patent application No. 14167213.9 filed on May 6, 2014; the contents of which is hereby incorporated by reference.

FIELD OF THE INVENTION

The invention relates to an electrical connector with a circuit board.

BACKGROUND OF THE INVENTION

A cable assembly including an electrical connector with a flexible printed circuit which electrically connects a flat cable to the connector is disclosed in U.S. Pat. No. 8,133,071 B2. The flexible printed circuit is supported by a spacer which is fastened to the electrical connector. The flexible printed circuit comprises a vertical connecting portion for making contact with the terminals of the connector and a horizontal connecting portion connected to the vertical connecting portion by means of a gradient connecting portion. The horizontal connecting portion comprises a plurality of pads for connecting the wires of the flat cable.

The U.S. Pat. No. 7,938,650 B2 describes a connector with a circular plug face comprising a printed circuit board. The circuit board functions as a connecting element between plug contacts of the connector and a connection block having connection contacts configured for connection of a data line connection. The printed circuit board is arranged in parallel to the cross-section of the connector and comprises a plurality of layers in a sandwich configuration, including layers having conductive traces and dielectric layers. Parallel plate capacitors are implemented in the circuit board.

A connector with a circular cross section comprising a flexible printed circuit cable is disclosed in U.S. Pat. No. 3,214,713. A base connector has male plug elements embedded in the base and protruding from the upper surface of the base connector and passing through the flexible printed circuit cable in a piercing manner. The plug elements are soldered to the flexible printed circuit cable. A dust cover or cap covers the upper portion of the connector with the solder connection to the flexible printed circuit cable.

The US patent application US 2011/0111628 A1 discloses a cable assembly comprising a printed circuit board (PCB) which is arranged in parallel to the mating direction. A front portion of the PCB is electrically connected to a plurality of contacts of the connector and a rear portion of the PCB is electrically connected to a plurality of conductive wires. A first and a second PCB can be stacked on top of each other. Conductive pads are provided on the PCB to create electrical contact with the plurality of contacts on the front and conductive wires on the rear portion. The distance between two adjacent rear conductive pads is larger than a distance between two adjacent front conductive pads. A similar embodiment is discloses in the U.S. Pat. No. 7,758,374 B2.

A shielded connector assembly comprising a semi-flexible circuit board is described in U.S. Pat. No. 5,474,473. The semi-flexible circuit board comprises opposite rigid end portions and an intermediate flexible portion. Conductor wire or pin connections are made with the rigid end portions and the flexible portion contains conductor paths which extend between the rigid portions. Such semi-flexible circuit boards can be used to convert round to rectangular connector geometries or for making angled connectors. Similar embodiments with more than one semi-flexible circuit board are shown in the international patent application WO 94/16478.

SUMMARY

Problem to be Solved by the Invention

It is an object of the present invention to provide an improved electrical connector with a circuit board.

Solution According to the Invention

According to the invention, the problem is solved by an electrical connector according to the preamble of claim 1, wherein the circuit board comprises a second horizontal connecting portion with pads.

An electrical connector is designed to be mated with a counterpart connector or socket. A mating direction is defined as the axis along which the plugging action is carried out.

According to the invention, the circuit board comprises a vertical connecting portion (VCP) for connecting the terminals with the traces, a first horizontal connecting portion (HCP) and a second HCP, both horizontal portions with pads for connecting strands from a cable. The vertical connecting portion (VCP) is an essentially flat surface which is oriented essentially perpendicular to the terminals and/or the mating direction of the electrical connector. In the electrical connector, at least 50% of the area of the first HCP is oriented at an angle with respect to the VCP, such that the circuit board spreads out in three dimensions. The second HCP is either physically connected to the VCP or to the first HCP. In the first case, at least 50% of the area of the second HCP is oriented at an angle with respect to the VCP. In the second case, at least 50% of the area of the second HCP is oriented at an angle with respect to first HCP. Orientating at least 50% of the areas of the HCPs at an angle with respect to the VCP can advantageously allow using a space behind the VCP for contacting strands with the pads on the HCPs.

The present invention can greatly simplify assembling the connector with a cable, in particular by increasing the space available for connecting each strand of the cable. Moreover, an electrical connector according to the invention can advantageously allow increasing the degree of automation in the production of cable assemblies compared to conventional electrical connectors. This can significantly reduce the production cost and effort. Furthermore, the quality and/or variability of electrical connections can be improved. In particular, the quality of the electrical connector can be improved in the sense that the stability of the manufacturing process can be increased and the number of rejects in manufacturing can be reduced. Also, the present connector can be more universal with regard to the suitable diameters of the cable strands. It is achievable that even rather thick strands can be attached to a connector according to the present invention.

PREFERRED EMBODIMENTS OF THE INVENTION

In a preferred electrical connector, the terminals are plugs and/or sockets. Preferred terminals are conductive and preferably transmit electrical signals (voltage and/or current), electrical power and/or provide an electrical connection to ground. In a preferred embodiment, at least one terminal is provided as a mechanical guide, for example to align the electrical connector with its counterpart and/or to define an orientation between electrical connector and counterpart. The terminals are preferably arranged in parallel to the mating direction. In some embodiments, an electrical connector may also comprise optical and/or other signal transmitting elements.

Preferably, the electrical connector is to be assembled with a cable which preferably comprises a plurality of strands. In the following, an electrical connector assembled with a cable is referred to as a cable assembly. In a typical cable assembly an electrical connector is assembled on each of the two ends of a cable. According to the invention, strands are individual solid wires, ribbons of wires and/or stranded wires or any other electrically conductive member and/or combination thereof. Preferably, each strand is surrounded by an electrically insulating material, which is preferably removed at the ends where the electrical connection between the strand and the pad is to be provided.

In a preferred embodiment the angle of an HCP with respect to the VCP is chosen such that strands coming from a cable arrive essentially in parallel to the surfaces of the pads disposed on the HCP. This can advantageously increase the overlap between the strands and the pads and may improve the bonding strength and/or the quality of electrical contact between strands and pads. Preferred bonding methods include soldering, gluing, crimping and clamping and preferably provide an electrical connection between a strand and a pad. In a preferred embodiment at least 50% of the area of each HCP is arranged at an angle between preferably 30 and 150 degrees with respect to the VCP, more preferably between 45 and 135 degrees, more preferably between 60 and 120 degrees, even more preferably around 90 degrees. Further, it is preferred that at least 50% of the area of the first HCP is arranged at an angle between preferably 30 and 150 degrees with respect to at least 50% of the area of the second HCP, more preferably between 45 and 135 degrees, more preferably between 60 and 120 degrees, even more preferably around 90 degrees. In a preferred embodiment in which the second HCP is physically connected to the first HCP, at least 50% of the area of the second HCP is oriented in parallel to the VCP. Here, 360 degrees correspond to a full rotation. According to the invention, also surfaces curved around the mating axis such as cylindrical or conical surfaces or sections thereof are considered horizontal. It is preferred that the pads are disposed on the outer surface of an HCP. Alternatively the pads are disposed on the inner surface of an HCP. Alternatively the pads are disposed on both sides of an HCP. This can for example be achieved by providing plated though-holes (vias), which plating can carry electricity from one side of the HCP to the other, and/or more than one layer of conductive traces as discussed further below. It is an achievable advantage of providing pads on both the inner and the outer surface of the HCP that a larger area is available for the pads and therefore for connecting strands from a cable to the electrical connector. Moreover, advantageously, the high frequency properties of the electrical connector can be improved.

It is preferred that the circuit board comprises a third connecting portion, more preferred is a circuit board with four, more preferably 5, more preferably 6, more preferably 7, even more preferably 8 or more horizontal connecting portions. It is preferred that the horizontal connecting portions are arranged symmetrically around the VCP. By increasing the number of HCPs, the available area for providing pads for soldering strands to the circuit board can be advantageously increased.

In a preferred embodiment of the invention, the circuit board is a flexible PCB (fPCB). Using fPCBs can achieve the advantage of simple and/or cheap manufacture. Preferred shapes can be realised in two dimensions and subsequently the flexible PCB can be bent and/or folded into the desired three-dimensional shape. Preferably, the VCP is reinforced, for example with a stiffener, for example a rigid plastic substrate, which preferably comprises holes for the receiving the terminals. Such a hybrid structure is also called a rigidised flex construction. Preferably the holes of the substrate coincide with holes in the fPCB for connecting the terminals to the traces, preferably by soldering. Preferably, also the HCPs are at least partially rigid or stiffened. Preferably, the stiff parts are the areas with the pads for soldering the strands. Preferred flexible PCBs comprise flexible polyimide (PI), PET, PEN, PEI, FEP or PEEK films with conductive traces, preferably made of copper, silver or gold. In other embodiments, the circuit board can be a rigid-flex circuit with rigid and flexible substrates that are preferably laminated together to form a single structure. Preferred flexible PCBs have a thickness of less than 500 µm, preferably less than 300 µm, more preferably less than 200 µm, even more preferably less than 100 µm.

In a preferred embodiment, the circuit board comprises only one layer of conductive traces. However, in some embodiments the circuit board comprises two or even more layers with conductive traces, which then typically are separated by a dielectric material. Preferably the circuit board is a flexible PCB with such multi-layer structure. Preferably, the multi-layer circuit board is continuously laminated together throughout the construction; except preferably at areas occupied by plated vias. A multi-layer circuit board can achieve the advantage of providing more area for routing conductive traces. Plated vias can help to make best use of the more than one layers of conductive traces. In particular, this can be of advantages in embodiments in which the circuit board comprises active and/or passive electronic and/or electromechanical components, as discussed further below.

In some embodiments of the invention, an entire grounding layer is implemented between signal layers. Preferably, also the housing is electrically connected to the grounding layer. In preferred embodiments, parallel plate capacitors can be implemented in the circuit board, preferably by forming conductive areas separated by a dielectric film. Preferably, the conductive traces are electromagnetically shielded, preferably by additional conductive layers to advantageously allow preventing cross talk and/or short cuts.

The area of the HCPs is preferably at least twice the area of the VCP, more preferably at least three times, more preferably at least four times, even more preferably at least six times the area of the VCP. Providing the HCPs with a large area can advantageously simplify the soldering of the strands to the pads provided on the HCPs. A large HCP area may advantageously allow for providing more pads, and preferably higher density electrical connectors can be implemented.

In a preferred electrical connector the horizontal connecting portions are fixedly mounted to a carrier element. Preferably the HCPs are removably fixated to the carrier element, for example using a frictional connection. A preferred frictional connection is realized as a protrusion in the carrier element and a matching hole in each HCP. Alternatively the HCPs may be permanently fixated to the carrier element, for example by means of glue. The carrier element can advantageously assist in providing the desired three-dimensional orientation of the HCPs with respect to the VCP. Further, the carrier element can assist in bonding the strands to the pads. Another achievable advantage is that shortcuts between pads from different HCPs can be prevented.

In a preferred embodiment the carrier element is a polyhedron comprising at least n+1 surfaces, where n is the amount of horizontal connection portions. More preferred are embodiments with n+2 surfaces. A preferred carrier element has the shape of a cuboidal block with six surfaces, preferably for fixating four HCPs. In an alternative embodiment the carrier element has the shape of a prism, preferably with a triangular base, more preferably a pentagonal base, even more preferably with a hexagonal base. The achievable advantage of providing the carrier element in the form of a polyhedron is that the empty volume surrounded by HCPs inside the electrical connector can be filled, for example with a mouldable plastic, for providing mechanical support.

In addition or alternatively to the carrier element, the entire PCB or at least sections of it, preferably all or at least part of the PCB's flexible sections, can be provided with a bendable but non-elastic layer for mechanically stabilizing the PCB. "Bendable" means that by applying force to the PCB during manufacture of the electrical connector, the PCB (preferably in particular the relative positions of the VCP and the HCPs) can be brought in a desired shape, and "non-elastic" means that the PCB does not return to its original shape after these forces are removed. The layer for mechanically stabilizing the PCB can for example be of copper. Partly or even entirely replacing the carrier element by the layer for mechanically stabilizing the PCB can be advantageous in particular if pads are provided on both the inner and the outer surface of the HCP.

It is preferred that a distance between two adjacent pads on a horizontal connecting portion is at least twice as large as the pitch between two adjacent terminals on the vertical connecting portion. The terminals of the electrical connector can be arranged with very short distances, especially in high-density electrical connectors with a large number of terminals. The larger the area of a pad and the larger the distance between pads, the easier and/or technically less challenging it becomes to bond strands to pads. Preferably, the HCPs provide a total pad area that is larger than the area of the VCP. Preferably the total pad area is twice the area of the VCP, more preferably three times the area of the VCP, even more preferably at least four times the area of the VCP. The achievable advantage of providing a large pad area is that an overlap between strands and pads can be increased, whereby the quality of an electrical connection and preferably also the mechanical strength of the bonding between pad and strand may be improved. Furthermore, it can become technically less challenging to bond the strands to the pads when their area is increased. Simplifying the process of bonding strands to the pads may significantly reduce the time and cost effort of producing cable assemblies with electrical connectors according to the invention. In particular, as compared to the prior art, the quality of the electrical connector can be improved in the sense that the stability of the manufacturing process can be increased and the number of rejects in manufacturing can be reduced.

It is preferred that the circuit board with the VCP and the HCPs is made in one single piece. According to the invention, a circuit board made in one piece can be made of a combination of materials, for example a sandwich of several layers of dielectric films and conductive metal foil, which are bonded together forming a unit. A circuit board made in one piece cannot be divided in more pieces without removing at least some material from it or cutting through it. A circuit board made in one piece can have the advantage that the manufacture of the circuit board may be very simple, fast, and thus cost-effective. Advantageously, the HCPs can be bent or folded to their desired angular orientation with respect to the VCP. In preferred embodiments of the invention, the circuit board is a single flexible PCB which preferably has a star-like shape with multiple HCPs arranged in a rotationally symmetric pattern around the VCP. In particular, embodiments with three, four, five, six, seven or eight HCPs are preferred. It is preferred that by bending the HCPs to about 90 degrees with respect to the VCP, the three-dimensional volume enclosed by the circuit board preferably resembles a prism with a triangular, rectangular, pentagonal, hexagonal, heptagonal, or octagonal cross-section.

In a preferred embodiment of the cable assembly, the electrical connector has a circular plug face. Circular plug faces have the achievable advantage that the cross-sectional area of the plug face can be maximal for a given diameter. Furthermore, electrical connectors with circular plug face may be advantageous because of their ease of engagement and disengagement, and their ability to conveniently house different types of terminals. Preferably the electrical connector has a circular plug face and preferably a cylindrical housing. In alternative embodiments other plug face geometries can be implemented, for example rectangular, square, oval, hexagonal, octagonal or other shapes. Advantageously, the invention may allow realising electrical connectors or adapters which convert plug face geometries, for example from rectangular to circular. In a preferred embodiment of a cable assembly, the electrical connector is an angled connector, preferably with an angle between 30 and 170 degrees, more preferably with an angle between 45 and 145 degrees, most preferably with a 90 degree angle between the plugging direction and the cable.

In a preferred embodiment of the cable assembly, the electrical connector is an AMC (Advanced Military Connector by ODU GmbH & Co KG, Mühldorf, Germany). AMCs fulfil military requirements and can be used in the field. In alternative embodiments the electrical connector is a USB connector or a D-sub connector or a mini-DIN connector. An achievable advantage is that these kinds of connectors are widely used with consumer electronics and/or computer hardware. However, the invention is by no means intended to be limited to any of the connector types listed above.

It is preferred that the electrical connector comprises seven or more terminals, more preferably the electrical connector comprises at least sixteen, more preferably at least 18, more preferably at least 20, more preferably at least 24, more preferably at least 32, more preferably at least 36, more preferably at least 40, more preferably at least 44, more preferably at least 48, more preferably at least 56, more preferably at least 64, more preferably at least 128, even more preferably at least 256 terminals. Alternative embodiments comprise 4, 5, 6, 8, 9, 10, 12, 14, 15, 25, 26, 31, 37, 50, 52, 62, 78, 79 or 100 terminals. Advantageously, the size of the HCPs can be adapted according to the area required for providing the amount of pads required in an electrical connector depending on the amount of terminals.

In a preferred embodiment of the invention, the circuit board comprises active and/or passive electronic and/or electromechanical components, for example capacitors, resistors, impedances, diodes, op amps, switches, integrated circuits and/or other components. Implementing electronic and/or electromechanical components into an electrical connector can advantageously improve the performance of the electrical connector, for example by reducing cross talk, matching impedances and/or performing signal enhancement. In particular, surface-mount devices (SMD) can be used with PCBs in an electrical connector since those parts are typically very small (few millimeters).

In a preferred embodiment the electrical connector comprises a housing for electrical insulation. Preferably, the housing protects the inside of the electrical connector from mechanical forces. More preferably, the housing acts as a shielding from electromagnetic fields. Further it is preferred that the housing protects the electrical connector from moisture, more preferably from dirt and/or dust. A preferred housing may also comprise functional elements, for example to (detachably) fixate the electrical connector to its mating counterpart, such as screws and/or clips and/or bayonet fixture and/or a label for identifying the electrical connector. The housing consists of one or more parts. Preferably, one part is conductive and one part is non-conductive. A preferred housing is made of plastic, metal and/or composite materials. A preferred housing has a cylindrical shape.

Preferably, the number of terminals is not the same as the number of strands. In a preferred cable assembly, the electrical connector comprises more terminals than strands in the cable. Preferably one or more terminals are used as mechanical guides and are preferably not connected to strands. Preferably, strands are firmly bonded to the pads, for example by soldering or crimping. Alternatively, strands are removably connected to the pads, for example using a frictional connection, provided for example by mechanical clips.

Preferably, the diameter of the strands is according to AWG40 or a larger diameter, more preferably according to AWG36 or a larger diameter. It is particularly preferred that the diameter of the strands is according to AWG32 or a lager diameter. AWG refers to "American wire gauge". Current-carrying electrical connectors often require AWG32 or a larger diameter. In some embodiments of the invention, the diameter of the strands is according to AWG28 or a larger diameter or even AWG24 or a larger diameter. Advantageously, the electrical connector according to the invention can accept strands with many different sizes, preferably AWG22, more preferably AWG20, more preferably AWG18, more preferably AWG16, even more preferably AWG14, or preferably even larger diameters. This can be possible, because the strands are soldered to pads on the circuit board and do not have to be soldered into solder cups as in conventional electrical connectors. In a preferred connector assembly, the diameter of the strands is larger than the diameter of the terminals, for example twice the diameter of the terminals. Electrically connecting strands with diameters larger than the terminals, especially in connectors with multiple terminals, is challenging in conventional electrical connectors. This problem can be overcome by using an electrical connector according to the invention in which the strands can be bonded to the pads of the circuit board.

In a preferred embodiment, a volume inside the housing is filled with a plastic, preferably an over-moulded plastic or a potting material, which is for example injected into an empty volume inside the housing. The plastic can advantageously fill the inside of the housing and may prevent dirt and/or moisture from penetrating inside the electrical connector. Further it may improve mechanical stability and the ruggedness of the electrical connector.

Manufacture of cable assemblies according to the invention can be significantly cheaper and faster. Automation of the soldering process is possible since solder cups to not have to be aligned. In a typical production process, the single flex PCB comprising the VCP and the HCPs is fixated and the strands and terminals are soldered to the flex PCB. Then the other connector components are assembled around the equipped flex PCB. The HCPs are clipped to the carrier element, whereby the desired three-dimensional shape with a small cross sectional area of the flex PCB is obtained.

BRIEF DESCRIPTION OF THE DRAWINGS

The invention is illustrated in greater detail with the aid of a schematic drawing.

DETAILED DESCRIPTION OF THE EMBODIMENTS OF THE INVENTION

Figure 1:
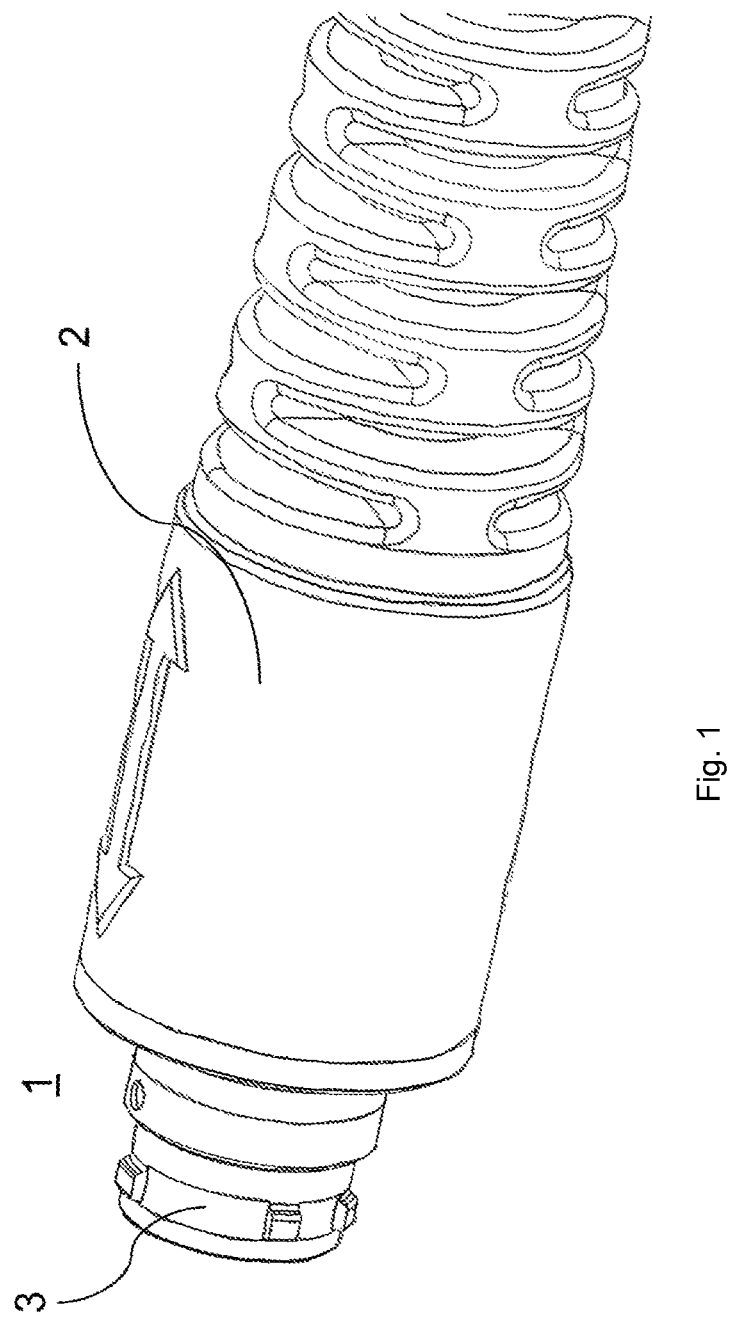
FIG. 1 shows an embodiment of an electrical connector in a perspective view.

An embodiment of an electrical connector 1 according to the invention is illustrated by means of schematic drawings. Depicted in FIG. 1 is an external view of the electrical connector 1, showing a cylindrical housing protecting the inside of the electrical connector from outside influences such as dirt, moisture and mechanical forces. The housing comprises a non-conductive part 2 made from moulded plastic and a conducting part 3 which is used as a grounding contact. The depicted electrical connector 1 is an AMC (Advanced Military Connector) which is especially suited for military applications because of its rugged design. The electrical connector 1 can be mated with a corresponding electrical connector socket. The mating action is to be carried out along the symmetry axis of the cylindrical connector.

Figure 2:
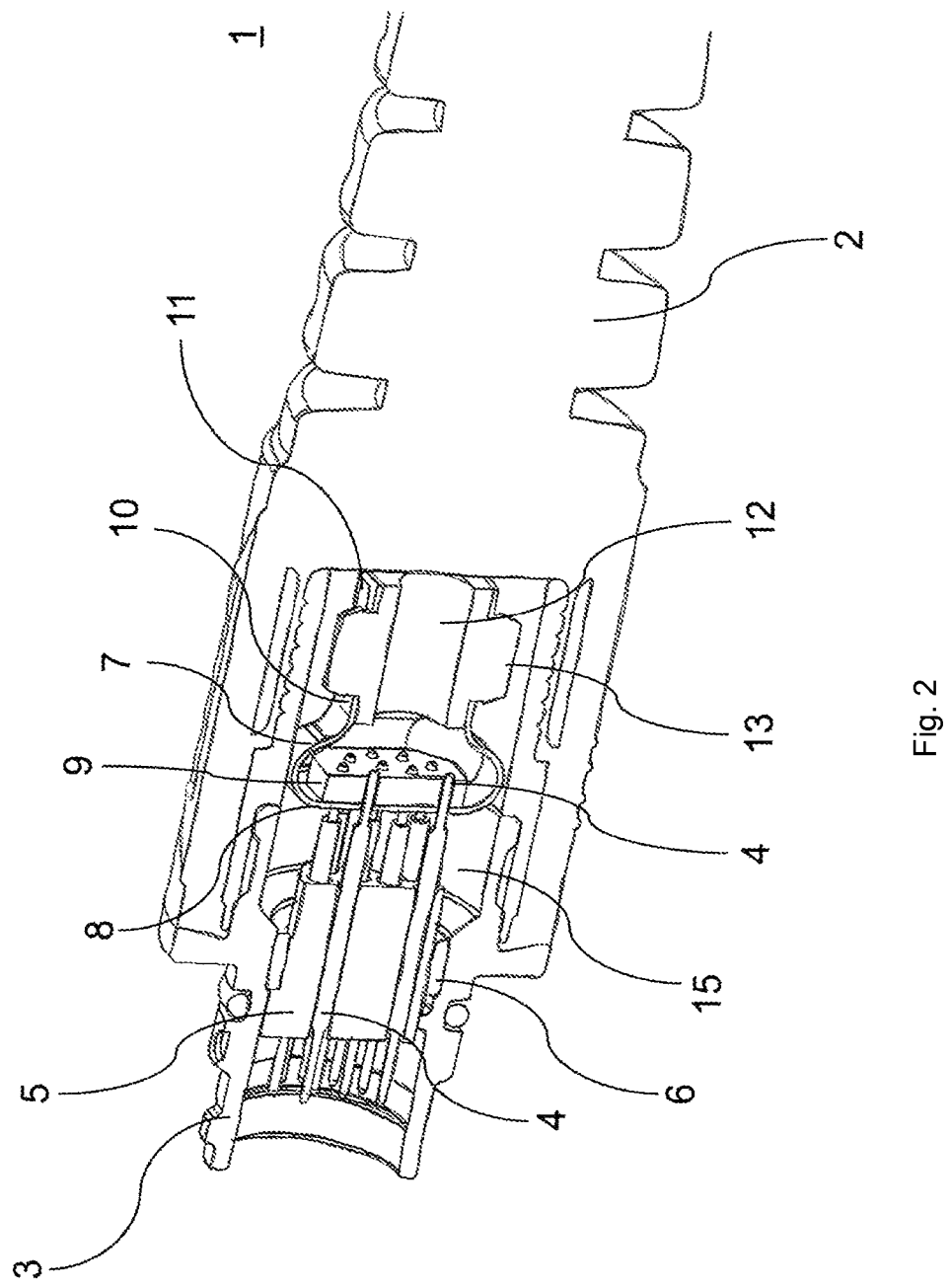
FIG. 2 shows a cross-sectional view of the electrical connector from FIG. 1.

More details of the electrical connector 1 become apparent in the cross-sectional view depicted in FIG. 2. The AMC 1 comprises sixteen terminals 4 which are formed as pins 4 of which nine are visible in FIG. 2. The depicted AMC 1 is a male connector. The pins 4 are arranged in a circular plug face and are being held by a cylindrical insert 5 made of a moulded piece of dielectric material. A press ring 6 is arranged between the insert 5 and the conductive part 3 of the housing, holding the cylindrical insert 5 in its position. Also, the press ring can prevents potting material to flow through the gap between the cylindrical insert 5 and the conducting part 3 of the housing when in a fluid state. It may also contribute to sealing the inside of the electrical connector 1 from moisture, air and dirt. The electrical connector 1 further comprises a flexible printed circuit board (fPCB) 7 with a vertical connecting portion (VCP) 8 to which a rigid plastic substrate 9 with holes 16 for receiving the pins 4 is laminated. The fPCB 7 further comprises four horizontal connecting portions (HCPs) 10 which extend from the outer circumference of the VCP 8 and bend towards the cable side of the electrical connector 1. The fPCB 7 including the VCP 8 and the four HCPs 10 is made in one single piece consisting of several layers with electrically conductive traces separated by a dielectric material, for example polyimide film. When not assembled in the electrical connector 1, the fPCB 7 has a shape that resembles a cross with the VCP 8 in the centre and the four HCPs 10 extending as the arms of the cross. In the connector 1, the traces provide electrical contact between the pins 4 and the pads 11 which are disposed on the HCPs 10 for connecting strands coming from a cable (not depicted). By bonding the strands to the pads 11 electrical contact is established between the strands and the pins 4.

Figure 3:
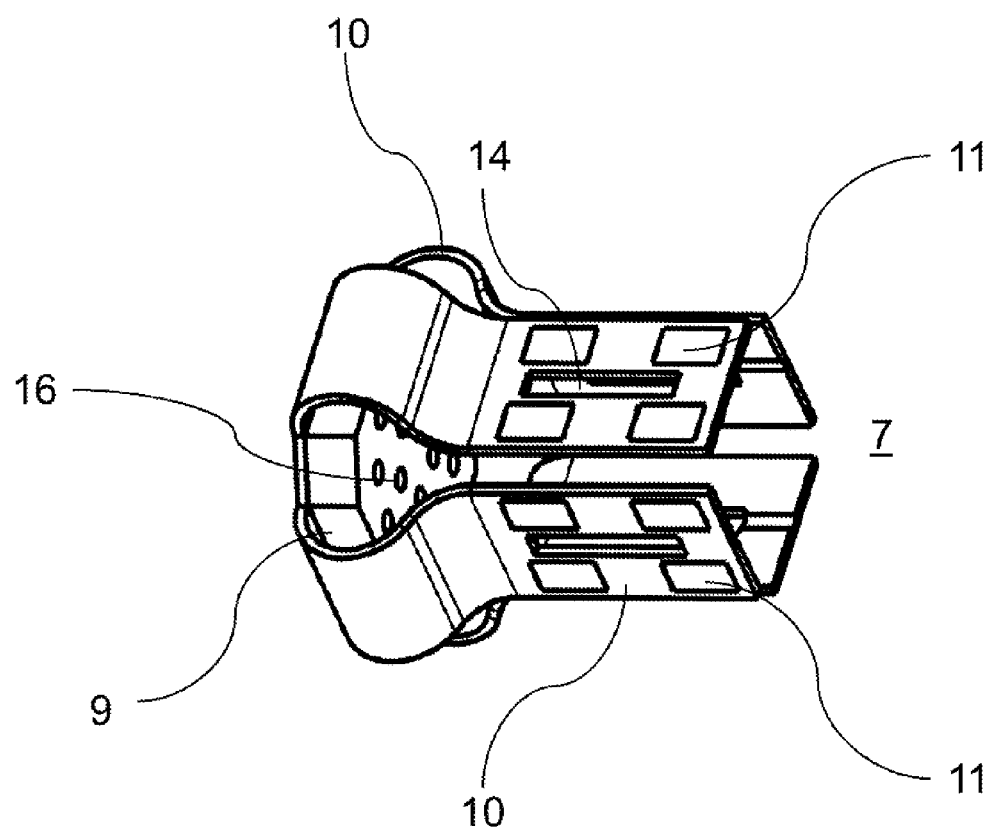
FIG. 3 shows a detail view of a circuit board with vertical and horizontal connecting portions.
Figure 4:
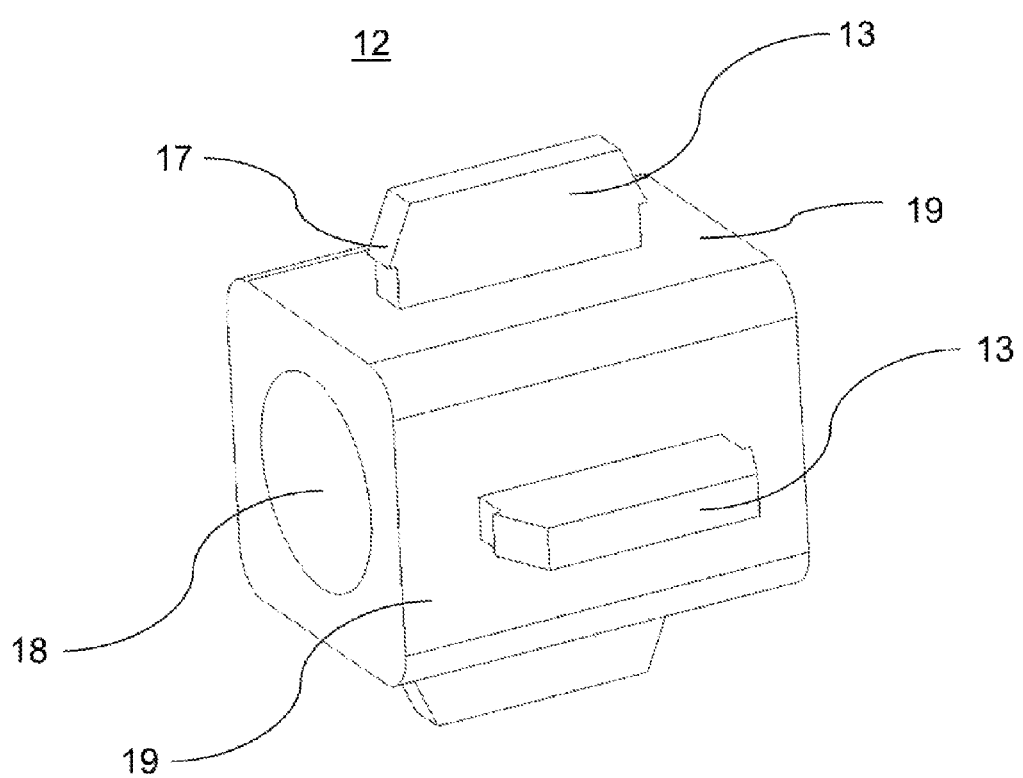
FIG. 4 shows a detail view of the carrier element.

A detailed view of the fPCB 7 with its VCP 8, four HCPs 10 and the pads 11 is shown in FIG. 3. The traces are not visible as they are arranged beneath an outer insulating layer of the fPCB 7. Four pads 11 are provided on each HCP 10. The portion of the HCP 10 where the pads 11 are located is essentially flat and makes up approximately 50% of each HCP 10. The portions with the pads are oriented at about 90 degrees with respect to the VCP 8, thereby enclosing a cuboid volume. Flexible intermediate portions connecting the portions with the pads 11 to the vertical connecting portion 8 are bent in a curved manner. The total area of the four HCPs 10 is about four times the area of the VCP 8. The distance between two adjacent pads 11 is at least twice as large as the pitch between two adjacent pins 4 in the VCP 8. Also the area of the pads 11 is considerably larger than the area of a hole for connecting a terminal 4. The size of the pads 11 and the distance between them simplifies soldering strands from a cable to the pads 11 and prevents unwanted short-cuts between two or more strands. Between the pads 11, the HCPs 10 comprise a rectangular opening 14 for mechanically fixating the HCPs 10 to a carrier element 12 which is depicted in FIG. 4.

The carrier element 12 has a cuboid shape with a protrusion 13 extending on each of the four surfaces 19 around a central axis which coincides with the mating axis of the electrical connector 1. In embodiments of the connector 1 where the connector 1 is an angled connector, the carrier element 12 may be oriented along an axis parallel to the mating direction, parallel to the cable comprising the strands or at an angle with respect to the cable and the mating direction. The protrusions 13 fit inside the rectangular openings 14 of the HCPs 10 and comprise hooks 17 for locking the HCPs 10 to the carrier element 12. Hereby the HCPs 10 are securely fixated to the carrier element 12 and align the portions with the pads 11 along the surfaces 19 of the carrier element 12. Along the central axis the carrier element 12 comprises a cylindrical hole 18. The empty volume 15 inside the electrical connector housing 2 as well as the central hole 18 of the carrier element 12 are injected with a soft plastic potting material for electrical insulation and mechanical protection as well as protection from moisture and dirt. The carrier element 12 can be mass produced by an injection moulding process.

Not shown in the figures, the fPCB 7 optionally comprises active and/or passive electronic and/or electromechanical components. For example, capacitors can be soldered onto the flexible PCB 7 for improving the quality of a signal transmitted by the electrical connector.

The features described in the above description, claims and figures can be relevant to the invention in any combination. Their reference numerals in the claims have merely been introduced to facilitate reading of the claims. They are by no means meant to be limiting.

LIST OF REFERENCE NUMERALS

1. Electrical connector
2. Housing (non-conductive part)
3. Housing (conductive part)
4. Terminals (pins)
5. Insert
6. Press ring
7. Circuit board
8. Vertical connecting portion
9. Rigid substrate
10. Horizontal connecting portion
11. Pads
12. Carrier element
13. Protrusion
14. Rectangular opening
15. Empty (filled) volume
16. Holes (for pins)
17. Hooks
18. Central hole
19. Surface

What is claimed is:

1. An electrical connector, comprising:
   a plurality of terminals; and
   a circuit board comprising
   a plurality of traces for electrically connecting the terminals with a plurality of pads;
   the plurality of pads for connecting strands from a cable with the traces;
   a vertical connecting portion for connecting the terminals with the traces; and
   a first horizontal connecting portion with pads;
   wherein the first horizontal connecting portion is physically connected to the vertical connecting portion;
   wherein the circuit board comprises a second horizontal connecting portion with pads.

2. An electrical connector according to claim 1, wherein the circuit board comprises a third horizontal connecting portion.

3. An electrical connector according to claim 1, wherein at least 50% of the area of each horizontal connecting portion is arranged at an angle between 30 and 150 degrees with respect to the vertical connecting portion.

4. An electrical connector according to claim 1, wherein the circuit board is a flexible printed circuit board.

5. An electrical connector according to claim 1, wherein the circuit board comprises at least two layers with conductive traces separated by a dielectric material.

6. An electrical connector according to claim 1, wherein the total area of the horizontal connecting portions is at least twice the area of the vertical connecting portion.

7. An electrical connector according to claim 1, wherein the horizontal connecting portions are fixedly mounted to a carrier element.

8. An electrical connector according to claim 7, wherein the carrier element is a polyhedron comprising at least n+1 surfaces, where n is the amount of horizontal connection portions.

9. An electrical connector according to claim 1, wherein a distance between two adjacent pads on a horizontal connecting portion is at least twice as large as a pitch between terminals on the vertical connecting portion.

10. An electrical connector according to claim 1, wherein the circuit board including the vertical connecting portion and the horizontal connecting portions is made in one single piece.

11. An electrical connector according to claim 1, wherein the electrical connector has a circular plug face.

12. An electrical connector according to claim 1, wherein the electrical connector comprises seven or more terminals.

13. An electrical connector according to claim 1, wherein the circuit board comprises active and/or passive electronic and/or electromechanical components.

14. An electrical connector according to claim 1, wherein the electrical connector comprises a housing.

15. An electrical connector according to claim 1, wherein the electrical connector is assembled with a cable comprising a plurality of strands, wherein the strands are connected to the plurality of pads.

16. An electrical connector according claim 15, wherein the diameter of the strands is according to AWG40 or a larger diameter.

17. An electrical connector according to claim 14, wherein a volume inside the housing is filled with a plastic.

18. An electrical connector according to claim 2, wherein at least 50% of the area of each horizontal connecting portion is arranged at an angle between 30 and 150 degrees with respect to the vertical connecting portion.

19. An electrical connector according to claim 2, wherein the circuit board including the vertical connecting portion and the horizontal connecting portions is made in one single piece.

\* \* \* \* \*